United States Patent [19]

Hulick

[11] Patent Number: 5,281,925
[45] Date of Patent: Jan. 25, 1994

[54] RF AMPLIFIER PROVIDING REDUCED DRIVE RESPONSE RISE TIMES AND FALL TIMES

[75] Inventor: Timothy P. Hulick, Schwenksville, Pa.

[73] Assignee: Acrodyne Industries, Inc., Blue Bell, Pa.

[21] Appl. No.: 977,873

[22] Filed: Nov. 17, 1992

[51] Int. Cl.[5] ............................................. H03F 3/04
[52] U.S. Cl. .................................. 330/296; 330/281; 330/141; 330/136; 307/268; 307/263
[58] Field of Search ............... 330/296, 281, 267, 141, 330/136; 307/268, 263

[56] References Cited

U.S. PATENT DOCUMENTS

| | | | |
|---|---|---|---|
| 4,087,761 | 5/1978 | Fukumoto et al. | |
| 4,379,996 | 4/1983 | Weber | 330/296 |
| 4,460,876 | 7/1984 | Najman | |
| 4,644,293 | 2/1987 | Kennett | 330/296 |
| 4,804,931 | 2/1989 | Hulick | |
| 4,924,191 | 5/1990 | Erb et al. | 330/130 |

Primary Examiner—Robert J. Pascal
Assistant Examiner—James A. Dudek
Attorney, Agent, or Firm—Mason, Fenwick & Lawrence

[57] ABSTRACT

The normally slow rise time of a Class C bipolar transistor grounded base RF power amplifier is greatly enhanced by circuitry external to the amplifier transistor. Current is injected into the base of the transistor for the duration of the rise time, biasing it into Class A operation during this period. Then, after the base current injection, operation reverts to Class C to retain amplifier power efficiency. Finally, the normally slow fall time of the bipolar Class C RF power amplifier is greatly enhanced by reverse-biasing the base-to-emitter junction during the fall time. During this fall time the amplifier is forced into its cutoff region by the applied reverse bias, as stored charge is pulled out of the base-emitter region of the transistor. In this manner, the power efficiency advantage of Class C power amplifiers may be retained, while adding the benefits of sharper output rise and fall times that would not otherwise be achieved.

12 Claims, 4 Drawing Sheets

RF AMPLIFIER PROVIDING REDUCED DRIVE RESPONSE RISE TIMES AND FALL TIMES

BACKGROUND OF THE INVENTION

1. Field of the Invention

The present invention relates to amplifiers. More specifically, the invention relates to amplifiers having improved performance characteristics with high-speed switching waveforms, particularly by enhancement of rise times and fall times for high-speed digital signals.

2. Related Art

As appreciated by those skilled in the art, "Class C" defines a class of amplifier which is non-linear, but highly power-efficient. Class C amplifiers are suitable for phase modulation, frequency modulation, or 100% pulse modulation.

Certain Class C amplifiers include an amplifying device, such as a bipolar transistor, as well as "external" circuitry that surrounds the device so that the amplifier as a whole performs its amplifying function.

At the higher frequencies, such as UHF and beyond, the grounded or common base configuration is the preferred configuration, because it offers higher gain than the grounded emitter configuration when using bipolar transistors. A common base amplifier with shunt supply voltage feed is shown in FIG. 1. "RFC" means radio frequency choke, providing a short circuit DC path to supply or ground.

For most applications, the speed at which such an amplifier responds to an RF input is not too important. For example, when an RF input signal is applied to a Class C RF power amplifier stage in a hand-held FM voice communication device, it is sufficient that the amplifier rise to its full output power before modulation is applied. In such applications, rise time may be as long as several hundred microseconds. Also, when the input signal is taken away (such as when reverting to the "receive" mode), fall time as long as several hundred microseconds is acceptable. In another example, FM broadcast transmitters are not concerned with enhancing rise time or fall time, because, as broadcast transmitters, they are turned on or off only once per day or are perpetually on. Similarly, fast rise or fall time is not crucial in pulse modulation using Class C amplifiers in radar applications, with a pulse width as short as one microsecond. If the ON time is considered to be from the 90% ON level to the 90% OFF level, the RF input pulse width may be adjusted to accommodate the slow response of the Class C amplifier.

However, in the modulator disclosed in U.S. Pat. No. 4,804,931 (Hulick), switched Class C amplifiers respond to the commands of an analog-to-digital converter, the purpose of which is to have many amplifiers power combined to synthesize an amplitude modulated output. In that patent, amplifiers must respond to the ON/OFF commands at a speed fast enough to avoid significant switching distortion. If a digitized video signal derived from an analog television video signal having a 4.2 MHz bandwidth is sampled at a frequency at least twice this bandwidth, each Class C amplifier may have to switch from OFF to ON to OFF in a total time span of no more than 119 nanoseconds. Clearly, Class C amplifiers requiring several microseconds or even several hundred nanoseconds to switch, cannot fill this need. Linear amplifiers can be used in modulators such as that in U.S. Pat. No. 4,804,931, but linear amplifiers are less power efficient and are therefore not a viable solution.

FIG. 2 is an oscilloscope trace of the detected RF output of a typical high power Class C UHF transistor amplifier driven with an input RF pulse having 10 ns rise and fall times. The circuit causing the illustrated output is a specific design derived from FIG. 1, using a 60 watt device operating at 645 MHz. In the illustrated example, rise time deteriorates to 300 ns and fall time deteriorates to 125 ns. This deterioration is unacceptable in many applications, for reasons outlined above.

FIG. 3 shows idealized waveforms for graphically demonstrating the rise time/fall time deterioration phenomena, as a background for understanding the motivation behind edge enhancement. Waveform (a), an idealized RF input pulse, is assumed to be input to a typical Class C amplifier, whose response is shown as output Waveform (b); rise time deterioration is $t_2 - t_1$, and fall time deterioration is $t_4 - t_3$.

The FIG. 1 conventional circuit's edge deterioration is believed to derive from the following causes. The transistor fails to turn on quickly because "on" bias must be derived from the input signal; until an input is applied, the transistor is biased off, causing deterioration in rise time. Conversely, fall time suffers because stored charge in the device must bleed on its own, because no help is provided with external circuitry.

Various amplifiers, and modifications and enhancements to amplifiers, are known in the art. U.S. Pat. No. 4,644,293 (Kennett) discloses an RF pulse modulated amplifier which transitions from Class A through Class AB to Class C operation. External circuitry is provided to sense the input signal and provide a control current which varies in accordance therewith. U.S. Pat. No. 4,924,191 (Erb et al.) discloses an amplifier having digital control over the operating point of several transistors. Digital control circuitry is used to sense the input signal and the operating environment, and provide biasing to the transistors. U.S. Pat. No. 4,460,876 (Najman) discloses an amplifier which operates in a "sliding Class A" mode by varying the bias on the output transistor as a function of the amplitude of the input signal. Finally, U.S. Pat. No. 4,087,761 (Fukumoto et al.) discloses an amplifier which can be operated in Class A, B, or AB by selectively switching bias values. The amplifier continues to operate in a selected mode continuously until manually switched. These patents, as well as all documents cited in this specification, are incorporated herein by reference as if reproduced in full.

Unfortunately, none of the known systems provides a way of improving rise times and fall times which automatically reacts to both rise time periods and fall time periods, so as to provide a self-adjusting compensation which improves rise times and fall times. It is to fill this need that the present invention is directed.

SUMMARY OF THE INVENTION

The invention provides an amplifier circuit for enhancing (providing steeper) rise and fall times, especially suitable for use in conventional Class C bipolar transistor amplifiers.

The invention provides an amplifier whose "Class" changes, based on a portion of a waveform being experienced. More specifically, during the rise time, the amplifier acts as a Class A amplifier, and, during the fall time, is in cutoff. Operation during the middle of the pulse is normal Class C operation.

To achieve this end in a particular preferred embodiment, a variable bias is provided, the variable bias being based on a reference voltage ultimately derived from the value of an input signal.

Thus, the invention provides an enhancement circuit for enhancing the performance of a Class C amplifying device in an amplifier, by reducing rise time deterioration and fall time deterioration experienced in response to an input signal having sharp rising and falling edges, the enhancement circuit causing the Class C amplifying device to function as a Class A amplifier during the rise time of the input signal, and causing the Class C amplifying device to function in cutoff during the fall time of the input signal.

The invention further provides an amplifier apparatus having a Class C amplifying device for amplifying an input signal having at least a first level and a second level, the Class C amplifying device exhibiting a rise time deterioration and a fall time deterioration, in combination with the enhancement circuit described above.

The invention also provides a method of enhancing performance of a Class C amplifying device in an amplifier, by reducing rise time deterioration and fall time deterioration experienced in response to an input signal having sharp rising and falling edges, the enhancement method including the steps of receiving the input signal; causing the amplifying device to operate as a Class A amplifier during the rising edge of the input signal; and causing the amplifying device to operate in cutoff during the falling edge of the input signal.

BRIEF DESCRIPTION OF THE DRAWINGS

The invention is better understood by reading the following Detailed Description of the preferred Embodiments with reference to the accompanying drawing figures, in which like reference numerals refer to like elements throughout, and in which.

DETAILED DESCRIPTION OF THE PREFERRED EMBODIMENTS

Figure 1:
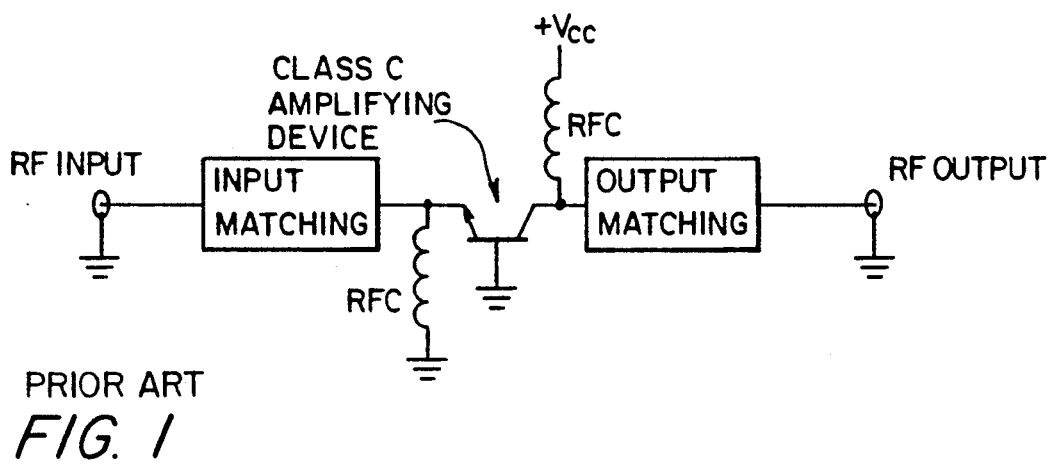
FIG. 1 illustrates a conventional (unenhanced) circuit topology to which may be applied the enhancement techniques according to the present invention.

In describing preferred embodiments of the present invention illustrated in the drawings, specific terminology is employed for the sake of clarity. However, the invention is not intended to be limited to the specific terminology so selected, and it is to be understood that each specific element includes all technical equivalents which operate in a similar manner to accomplish a similar purpose.

The invention recognizes that, if a pulse of current is provided through the base-emitter junction of an amplifier's amplifying device at the moment input power is applied, and the pulse of current is maintained for the duration of an (otherwise) slow rise time, turn-on time for the device is reduced to essentially that of the input pulse. Likewise, if reverse bias voltage is applied to the base-emitter junction of the device at the moment that input is removed, stored charge is drained quickly, thus reducing the fall time to essentially that of the input pulse.

The invention provides external circuitry to perform these two functions, preferred embodiments of which are described in detail below. Advantageously, the invention provides circuitry that is automatic and self-adjusting.

Figure 3:
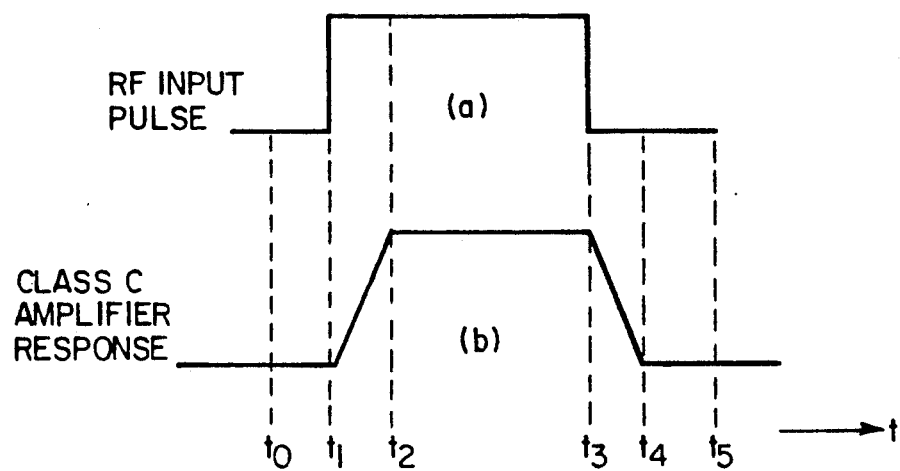
FIGS. 3a-b show idealized waveforms for graphically demonstrating the rise time and fall time deterioration phenomena, as a background for motivating corresponding edge enhancement requirements. Waveform (a), an idealized RF pulse is assumed to be input to a typical Class C amplifier, whose response is shown as Waveform (b); rise time deterioration is $t_2-t_1$, and fall time deterioration is $t_4-t_3$.

According to the present invention, the rise time in the Class C amplifier response shown in FIG. 3 may be enhanced with an injection of base current during the time between $t_1$ and $t_2$. Also, the fall time is enhanced by forcing the base-emitter junction of the device to be reverse-biased during the time period between $t_3$ and $t_4$.

Figure 4:
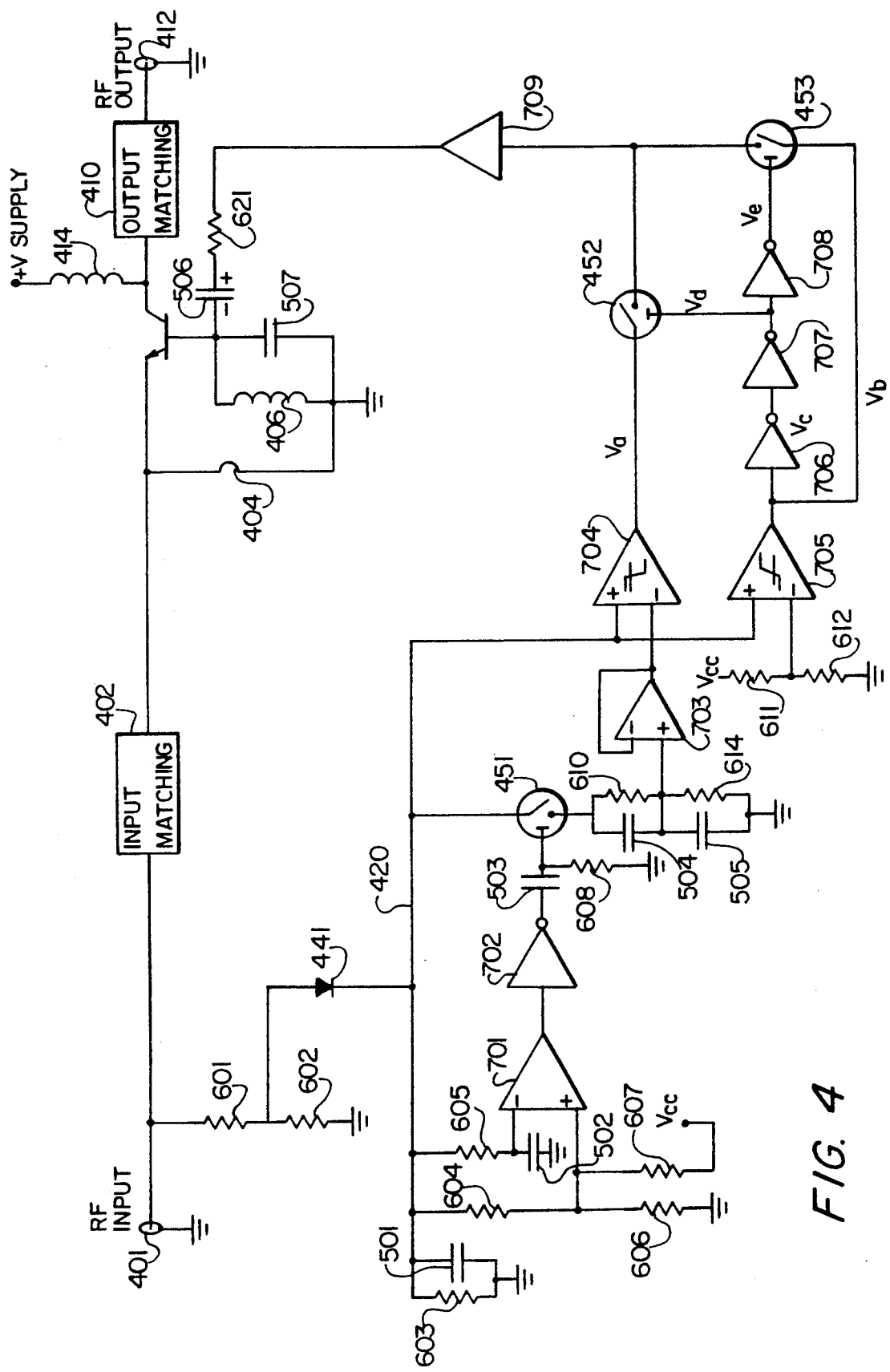
FIG. 4 schematically illustrates functional elements of an enhancement circuit according to a preferred embodiment of the present invention.

FIG. 4 schematically illustrates a circuit that provides the base current pulse and reverse base-emitter junction voltage pulse thus described.

Referring to FIG. 4, similar to FIG. 1, the RF input signal on input path 401 is received by an input matching network 402. The output of the matching network 402 is connected to the emitter of an npn transistor 400, with transistor 400 constituting the Class C amplifying device. An RF choke 404 shunts the emitter to ground. The base of transistor 400 is connected to ground through a parallel arrangement of a second RF choke 406 and bypass capacitor 507. The collector of transistor 400 is connected to an output matching network 410, whose output constitutes the RF output 412 of the enhanced amplifying circuit. The collector is also connected to the +V supply through a third RF choke 414.

A preferred embodiment of the enhancement circuitry is shown schematically in FIG. 4.

Input path 401 is connected through two resistors 601, 602 to ground. The intermediate node between resistors 601, 602 is connected to the anode of a diode 441. The cathode of diode 441 is connected to ground through a parallel arrangement of a resistor 603 and a capacitor 501.

A voltage comparator 701 is provided, having inverting and non-inverting inputs. The voltage at the comparator inputs is derived from the cathode of diode 441, the node being indicated as node 420 for convenience. The voltage at node 420 drives a voltage divider including resistors 604, 606, the intermediate node being connected to the comparator's non-inverting input. Another resistor 607 leads from the non-inverting input to +Vcc. The voltage at node 420 also drives a series combination of a resistor 605 and a capacitor 502, with the intermediate node therebetween being connected to the comparator's inverting input.

Comparator 701 drives a series arrangement of inverter 702, a capacitor 503, and a resistor 608, to ground. The node between capacitor 503 and resistor 608 is connected to the control input of a switch 451. When its control input is high, switch 451 connects node 420 to a series arrangement of two sets of parallel RC pairs, the series arrangement leading to ground. Parallel RC pair 610, 504 form an intermediate node with parallel RC pair 614, 505 which intermediate node drives the non-inverting input of an operational amplifier 703. The output of operational amplifier 703 is fed back to its inverting input, so that it essentially functions as a voltage follower for isolation purposes.

Operational amplifier 703 drives the inverting input of a voltage comparator 704, whose non-inverting input receives the voltage on node 420. Node 420 is also connected to the non-inverting input of another voltage comparator 705. The inverting input of the voltage comparator 705 is driven by the intermediate node of a voltage divider including resistors 611, 612 extending between +Vcc and ground. For future reference, the respective outputs of comparators 704, 705 are referred to as $V_a$ and $V_b$.

A series arrangement of inverters 706, 707, 708 are provided at the output of voltage comparator 705, for receiving $V_b$. The outputs of inverters 707, 708 control respective switches 452, 453, which switches respectively receive $V_a$ and $V_b$. In this arrangement, either $V_1$ or $V_b$ drives the input of a buffer element 709. Buffer element 709 drives the base of RF amplifier transistor 400 via a resistor 621 and a capacitor 506.

A description of circuit operation follows. It is assumed that each active circuit element (the voltage comparators, logic inverters and operational amplifier) exhibits an 8 ns delay. It is further assumed that the input matching network 402 provides a perfect impedance match for RF amplifier transistor 400: that is, no reflections appear at the RF input port 401.

Comparators 701, 702, switch 451 and operational amplifier 703 and surrounding components establish a self-adjusting fall time reference voltage for the inverting input of comparator 704.

More specifically, the RF input power voltage is divided by resistors 601 and 602 to an arbitrary low voltage (such as 1.0 volt). The divided voltage is peak detected by diode 441. Diode 441 detects the input pulse, causing an envelope voltage to appear across capacitor 501. Resistor 603 discharges capacitor 501 to ground, between input pulses.

A portion of the input pulse instantaneously appears at the node between resistors 604 and 606, because no capacitance is associated with this resistive divider 604, 606. However, the voltage at the intermediate node between 502 and 605 starts from zero at the beginning of a detected input pulse, causing the inverting input of voltage comparator 701 to initially see a lower voltage than at the non-inverting input. This signal comparison causes the output of comparator 701 to remain at a logic high until capacitor 502 charges to a voltage value greater than that at the non-inverting input. The RC time constant of resistor 605 and capacitor 502 is chosen so that the output of comparator 701 changes from a high state to a low state after the detected input pulse reaches its full rising edge, near the top of the envelope.

Inverter 702 inverts the output of comparator 701. The output of inverter 702 changes to a high state after the input pulse has reached its maximum value. When inverter 702 changes to a high state, switch 451 receives a positive pulse of short duration (10–20 nanoseconds) through capacitor 503, causing switch 451 to close. The voltage value at the maximum or top of the detected input pulse (on node 420) instantaneously charges capacitors 504 and 505. When the short pulse at the control input (gate) of switch 451 disappears after capacitor 503 is charged, switch 451 opens and the detected pulse voltage is retained across capacitors 504 and 505.

The relative values of capacitors 504 and 505 are chosen to be about 10:1 so that 90% of the detected pulse value appears across capacitor 505. Resistors 610 and 614 are high-value resistors placed in parallel with capacitors 504 and 505, respectively, but inverse in relative value to allow the same voltage division. These resistors serve to bleed the retained voltage from capacitors 504 and 505, if the time between detected RF drive pulses is long and the detected pulse peak level should change with time. The voltage across capacitor 505 serves as a voltage comparator reference for comparator 704 (after isolation buffering by operational amplifier 703 to prevent loading of capacitor 505).

Figure 5:
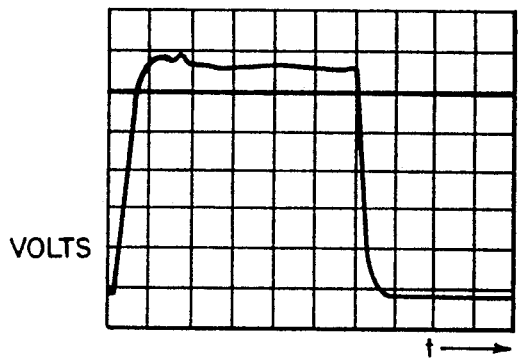
FIG. 5 is an oscilloscope trace of a reference voltage (the constant value trace) derived from an input pulse (also shown), the reference voltage determining the value at which comparator 704 (FIG. 4) changes state near the beginning of the fall time of the input signal.

An oscilloscope trace of the DC voltage across capacitor 505, which is derived from an actual input pulse, is shown in FIG. 5, superimposed with a trace of the signal on node 420. Comparator 704 changes from a high state to a low state when the comparator's non-inverting input pulse falls below the derived reference, near the beginning of its fall time.

Similar to the reference voltage arrangement described above, another voltage divider, this one including resistors 611 and 612, establishes a reference voltage near zero volts for voltage comparator 705. When there is no input pulse, or between input pulses, the detected pulse voltage is zero and the output of comparator 705 is low. Near the beginning of the input pulse, the voltage detected at the non-inverting input of comparator 705 soon exceeds the fixed reference at the inverting input, thus causing the output of comparator 705 to change state.

Figure 6:
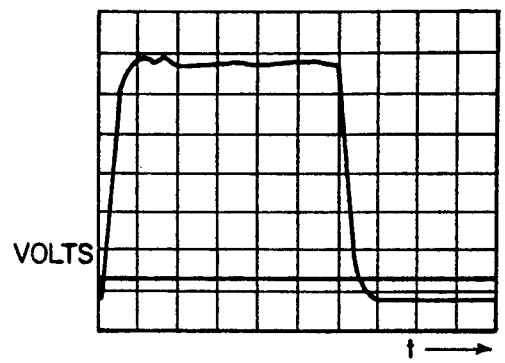
FIG. 6 shows an oscilloscope trace of a fixed reference voltage (the constant value trace) input to a rise time comparator, a rising input square wave pulse (also shown) causing comparator 705 (FIG. 4) to change state when the reference voltage is crossed near the beginning of the rise time of the input signal.

These two inputs to voltage comparator 705 are shown in FIG. 6. Comparator 705 changes from a low state to a high state when the comparator's non-inverting input rises above the reference voltage, near the beginning of its rise time.

Figure 7:
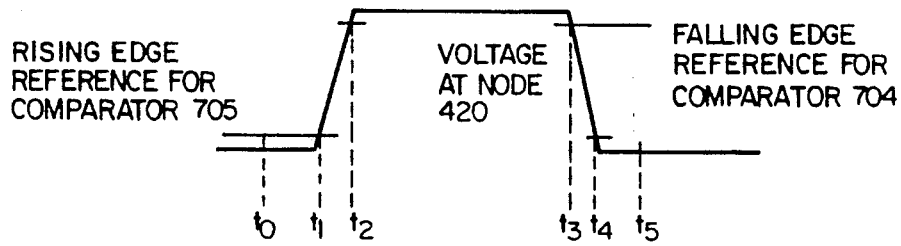
FIG. 7 is an idealized timing diagram showing the levels of the rise time and fall time reference voltages used by comparators 705 and 704, respectively, superimposed on a detected signal derived from the input signal.

FIG. 7 is an idealized timing diagram showing the signal at node 420, with the relative placement of the rise time and fall time reference voltages used by comparators 705 and 704, respectively. Based on the foregoing discussion, comparators 705 and 704 may be termed rise time comparator and fall time comparator, respectively.

It will be appreciated by those skilled in the art that an input-derived reference voltage is used for input to the fall time comparator 704 only, because an ideal crossover magnitude will be different, for different input signal magnitudes. In contrast, the same constant reference voltage, that derived from a simple voltage divider, may be used for the rise time comparator 705, because the ideal crossover magnitude will not be substantially different, for different input signal magnitudes. Of course, the illustrated embodiment may be modified in accordance with principles known to those skilled in the art, while still remaining within the scope of the invention.

The portion of the circuit between the rise and fall time comparators 705, 704, and buffer 709, is best described by means of a truth table, shown in the following Table I.

In Table I, voltage values at various points in the circuit of FIG. 4 are defined at various times $t_0$ through $t_5$ shown in FIG. 7. An 8 ns delay for each active element is assumed in the accompanying discussion.

TABLE I

|  | $t_0$ | $t_1$ | $t_2$ | $t_3$ | $t_4$ | $t_5$ |
|---|---|---|---|---|---|---|
| $V_a$ (704) | X | X | H | L | L | X |
| $V_b$ (705) | L | H | X | X | X | L |
| $V_c$ (706) | H | H | L | L | L | H |
| $V_d$ (707) | L | L | H | H | H | L |
| $C_e$ (708) | H | H | L | L | L | H |
| 709 | L | H | H | L | L | L |

"H" denotes high logic state; "L" denotes low logic state; and "X" denotes "don't care".

The input logic signal to buffer 709 switches high when the node-420 (non-inverting) input to rise time comparator 705 crosses the rise time reference voltage (at the inverting input), and switches low again when the node-420 (non-inverting) input to fall time comparator 704 crosses its fall time reference (at the inverting input). The former switching occurs when $V_e$ (the output of inverter 708) is high and $V_b$ changes to high (at time $t_1$). The latter case occurs when $V_d$ (the output of inverter 707) is high and $V_a$ changes to low (at time $t_3$). Thus, though it may at first appear that a short circuit is possible when (A) both switches 452 and 453 are closed and (B) $V_a$ and $V_b$ are opposite in polarity, in fact, the previous analysis shows that both conditions (A) and (B) cannot simultaneously exist.

Buffer 709 may be simply implemented as a current amplifier providing an output corresponding to the logic level of its input. As the buffer changes to a high state during rise time, then capacitor 506, being uncharged, initially looks like a short circuit, passing current through resistor 621 into the base-emitter junction of the amplifier transistor 400.

Elements 704–709 and associated circuitry provide a current control signal at the output of buffer 709, to ensure that the operation of transistor 400 is governed strategically, in accordance with the principles of the invention. In particular, the output of buffer 709 operates with discrete components associated with the transistor, to ensure operation in Class A during the rising edge of the input pulse at 401, normal (substantially unaltered) operation during the "plateau" of the input pulse, and operation in cutoff during the falling edge of the input pulse. In particular, the discrete components including capacitor 506 act as a differentiator to mathematically differentiate (take the first derivative of) the current control signal output by the buffer 709. In response to the pulse output by the buffer, the differentiator first provides a positive impulse of current to the amplifying device during the rising edge of the input signal, and then provides a negative impulse during the falling edge.

Special reference is made to FIG. 7. The RC time constant of capacitor 506 and resistor 621 (FIG. 4) is chosen to be large enough to allow sufficient time for base current to flow until transistor 400 would normally be turned on by an RF input signal. The discrete components function as a differentiator acting on the current control signal from buffer 709. Therefore, during the rise time ($t_1$ to $t_2$ in FIG. 7), the base of transistor 400 is given a decaying pulse of current that is limited by resistor 621. After a sufficiently long time, the transistor's base current from buffer 709 goes to zero as capacitor 506 charges and RF choke 406 functions as a DC short circuit. In this manner, the base of transistor 400 is given a rise time current pulse causing the transistor to function as a Class A amplifier for a chosen period of time, thus enhancing rise time of the amplifier apparatus as a whole.

Then, after the rise time pulse but before the fall time, the transistor reverts to operation as a Class C amplifier.

Finally, when the output of buffer 709 falls to its low state, the input to the transistor 400 begins to fall, and the positive side of capacitor 506 is grounded through resistor 621 and buffer 709. Because RF choke 406 once again initially appears as an open circuit, reverse bias is applied through RF choke 404 across the transistor's base-emitter junction. This reverse bias pulls stored charge out of the base region, resulting in fast fall time due to fast turn-off of transistor 400.

Values of other circuit elements in FIG. 4 may be chosen with the following points in mind. The value of capacitor 507 is small compared to that of capacitor 506; being only for RF bypassing, it is of little functional consequence. The value of RF choke 406 is much larger than that of RF choke 404, as the former must initially look like an open circuit. However, the base current flows to the emitter and through RF choke 404 to ground, until capacitor 506 is charged and RF choke 406 has become a short circuit.

Figure 2:
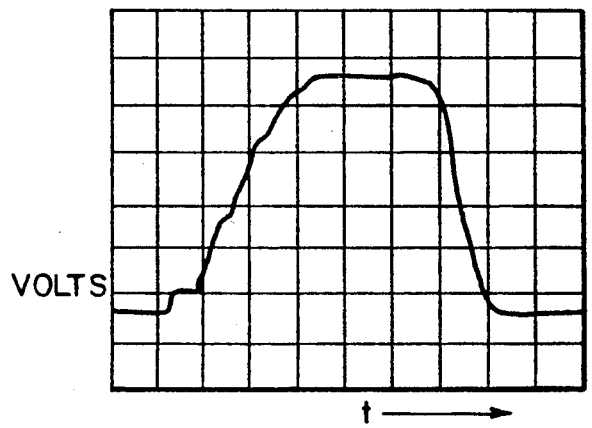
FIG. 2 illustrates on oscilloscope trace (horizontal scale, 100 ns per division) of an output pulse with 300 ns rise time and 125 ns fall time, from a typical 60 W Class C UHF bipolar power transistor when driven with an input pulse with 10 ns rise and fall times.
Figure 8:
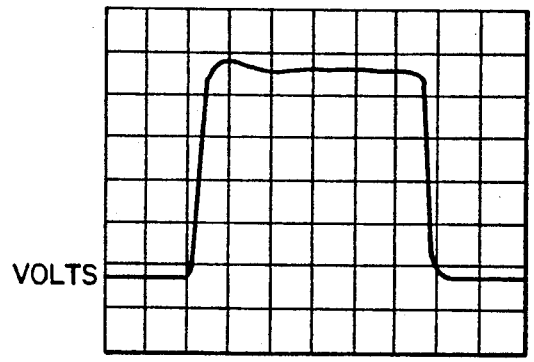
FIG. 8 illustrates an oscilloscope trace (horizontal scale is 100 ns/division) of a circuit having the same amplifying device as that shown in FIG. 2, but using a preferred rise time and fall time enhancement circuit according to the present invention.

FIG. 8 is an oscilloscope trace illustrating the "enhanced" rise and fall times provided by the preferred embodiment of the invention, as compared with the unenhanced results shown in FIG. 2. Rise time is improved substantially, from 300 ns to 25 ns, while fall time is likewise improved substantially, from 125 ns to 25 ns.

Figure 9:
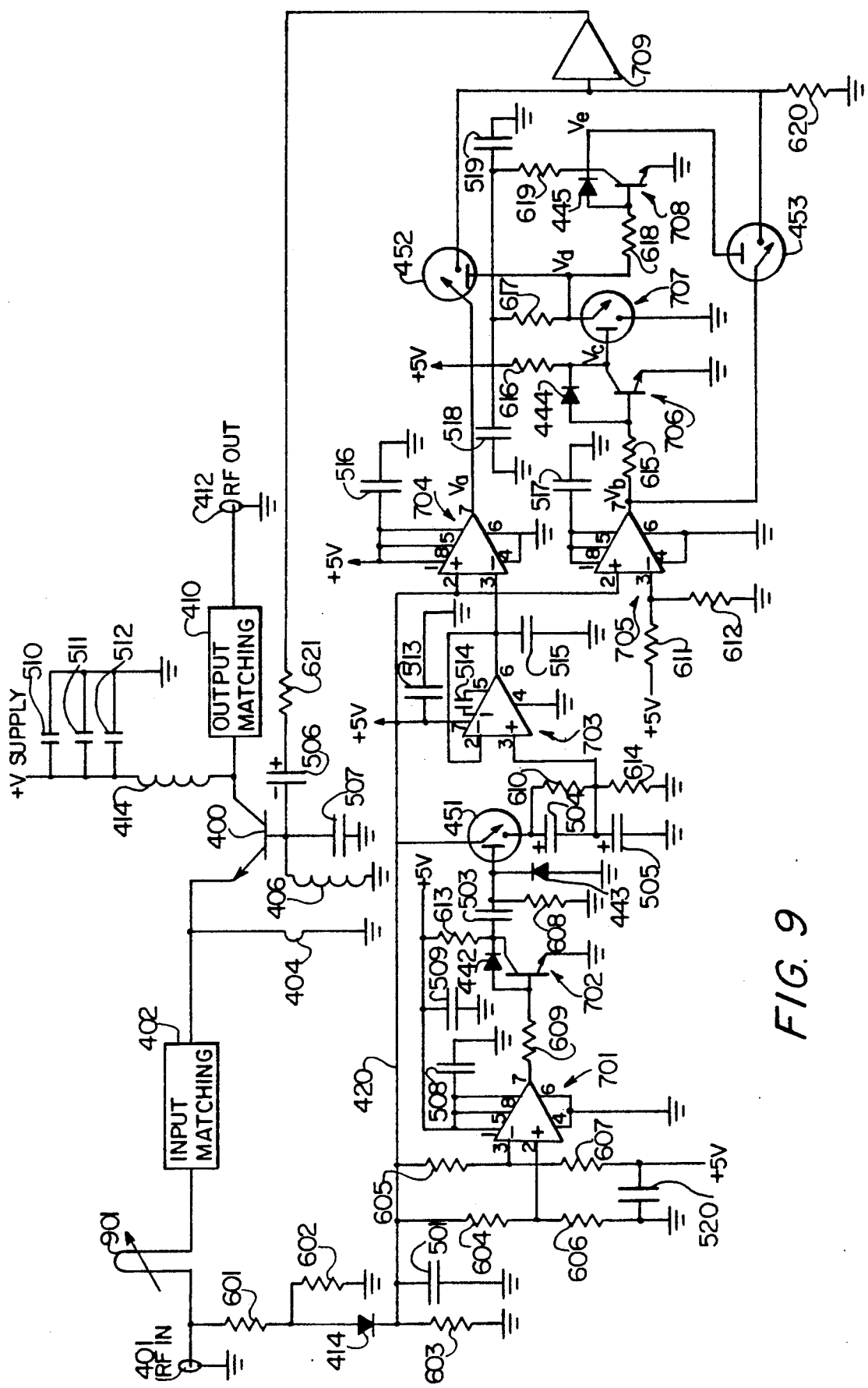
FIG. 9 is a detailed circuit diagram which is a preferred embodiment of the inventive circuit shown schematically in FIG. 4.

FIG. 4, described above, is presented as a functional block diagram. A more detailed practical embodiment is shown in FIG. 9. Unless otherwise indicated, element designators in FIG. 4 translate to FIG. 9 without change, and may be assumed to have the same value and function.

In FIG. 9, an RF delay line 901 has been specifically illustrated, showing how to ensure that rise time and fall time pulses arrive at the correct respective times, when transistor 400 actually receives its RF input signal and when it is actually taken away. This addition is provided because the RF delay to arrival at transistor 400 could be different from the logic delay passing through the enhancement circuit.

Comparators 701, 704, and 705 are preferably fast voltage comparators, and may be implemented by MAXIM type MAX903 or equivalent. Operational amplifier 703 is preferably a slow JFET operational amplifier with near-infinite input impedance.

A diode 443 prevents the gate of switch 451 from receiving a negative spike when transistor 702 (operating as an inverting switch) closes.

Another diode 442 prevents transistor 702 from saturating when ON, so that it is quick to become an effective open circuit as the output of comparator 701 goes low. Diodes 444 and 445 serve the same purpose as diode 442, as transistors can form an open circuit much faster when non-saturated than when saturated.

Switches 451, 452, 453, 707 may be implemented using a quad analog bilateral CMOS switch. Since only the first three switches are used for switching in the common sense of the word, "switch" 707 is used in an inverter configuration.

Resistor 620 is a fast pull-down resistor for the buffer current driver, applied to the input of buffer 709 so that it transitions to a low state quickly at the fall time crossover point (see FIG. 5).

Resistor 607 prevents any ambiguity from being presented to the input of comparator 701 in the absence of a detected input pulse. It is provided for the following reason. When there is no input pulse, both inputs to comparator 701 would be zero volts. Resistor 607 provides a small positive voltage to the non-inverting input of the comparator to ensure that the output state of the comparator is high under these circumstances.

The various 0.1 µF capacitors (except capacitor 506) are simply bypass capacitors of little functional importance.

Capacitor 502 (at the input of comparator 701 in FIG. 4) is omitted from FIG. 9 because the input capacitance at pin 2 of comparator 701 is sufficient for this purpose.

Specific component values in the illustrated embodiment are shown in TABLE II:

TABLE II

| Diodes | |
| --- | --- |
| 441 | 1N5711 |
| 442 | 1N5711 |
| 443 | 1N5711 |
| 444 | 1N5711 |
| 445 | 1N5711 |

| Capacitors | |
| --- | --- |
| 501 | 10 pF |
| 502 | Input capacitance of comparator 701 |
| 503 | 10 pF |
| 504 | 4.7 µF |
| 505 | 0.47 µF |
| 506 | 0.1 µF |
| 507 | see below |
| 508 | 0.1 µF |
| 509 | 0.1 µF |
| 510 | see below |
| 511 | see below |
| 512 | see below |
| 513 | 0.1 µF |
| 514 | 0.01 µF |
| 515 | 0.1 µF |
| 516 | 0.1 µF |
| 517 | 0.1 µF |
| 518 | 0.1 µF |
| 519 | 0.1 µF |
| 520 | 0.1 µF |

| Resistors | |
| --- | --- |
| 601 | See below |
| 602 | See below |
| 603 | 270 Ω |
| 604 | 1 KΩ |
| 605 | 1 KΩ |
| 606 | 2 KΩ |
| 607 | 30 KΩ |
| 608 | 1 KΩ |
| 609 | 1 KΩ |
| 610 | 100 KΩ |
| 611 | 100 KΩ |

TABLE II-continued

| | |
| --- | --- |
| 612 | 1 KΩ |
| 613 | 100 Ω |
| 614 | 1 MΩ |
| 615 | 1 KΩ |
| 616 | 100 Ω |
| 617 | 510 Ω |
| 618 | 1 KΩ |
| 619 | 100 Ω |
| 620 | 510 Ω |
| 621 | 5 Ω (This value depends on the RF transistor used) |

| Chokes | |
| --- | --- |
| 404 | small compared to 406; absolute value depends on transistor chosen |
| 406 | large, compared to 404 |
| 414 | of sufficient size to allow chosen transistor to operate properly |

| Active Elements | |
| --- | --- |
| 451 | ¼ 74HC4016 Bilateral Analog Switch |
| 452 | ¼ 74HC4016 Bilateral Analog Switch |
| 453 | ¼ 74HC4016 Bilateral Analog Switch |
| 701 | MAX903 voltage comparator |
| 702 | MPS2369 transistor |
| 703 | CA3130 operational amplifier |
| 704 | MAX903 voltage comparator |
| 705 | MAX903 voltage comparator |
| 706 | MPS2369 transistor |
| 707 | ¼ 74HC4016 Bilateral Analog Switch |
| 708 | MPS2369 transistor |
| 709 | 74BCT25244 |

The values of capacitors 507, 510, 511, 512 depend on the RF frequency of the Class C amplifier. They are RF bypass capacitors of sufficient size to be effective at radio frequencies but never large enough to prevent capacitor 506 from being dominant at the gating or modulation frequency. The values of resistors 601, 602 depend on the magnitude of the RF drive, and on the power capability and gain of the transistor. These values are specific to the amplifier, but are chosen to provide about 1 volt at their intermediate node. If not specifically enumerated above, remaining elements are readily capable of understanding and implementation by those skilled in the art.

Thus, in view of the foregoing, it will be appreciated that the invention provides an amplifier, an enhancement circuit for an amplifier, and a method of enhancing the performance of an amplifier.

In particular, the invention provides an enhancement circuit for enhancing the performance of a Class C amplifying device in an amplifier, by reducing rise time deterioration and fall time deterioration experienced in response to an input signal having sharp rising and falling edges, the enhancement circuit causing the Class C amplifying device to function as a Class A amplifier during the rise time of the input signal, and causing the Class C amplifying device to function in cutoff during the fall time of the input signal.

The invention further provides an amplifier apparatus having a Class C amplifying device for amplifying an input signal having at least a first level and a second level, the Class C amplifying device exhibiting a rise time deterioration and a fall time deterioration, in combination with the enhancement circuit described above.

More specifically, the invention provides an embodiment of an amplifier apparatus having a Class C amplifying device for amplifying an input signal having at least a first level and a second level, the Class C amplifying device exhibiting a rise time deterioration and a fall time deterioration. The amplifier apparatus further has an enhancement circuit with the following elements: a circuit for generating a detected signal in response to the input signal; a first reference generation circuit for providing a first reference in response to the input signal; a fall time comparator for comparing the detected signal to the first reference and for providing a first comparison signal; a second reference generation circuit for providing a second substantially invariant reference; a rise time comparator for comparing the detected signal to the second reference and for providing a second comparison signal; and a multiplexer for controllably combining the first and second comparison signals and providing a current control signal to the Class C amplifying device so that it operates as a Class A amplifying device during the rise time and operates in cutoff during the fall time, to reduce the rise time deterioration and fall time deterioration.

Even more specifically, the invention provides a preferred embodiment of an amplifier apparatus for reducing rise time deterioration and fall time deterioration experienced in response to an input signal having sharp rising and falling edges, the amplifier having the following elements: an RF input port for receiving the input signal; a Class C amplifying device for amplifying the received input signal; a peak detector for detecting a peak value of the received input signal so as to provide a detected peak signal; a first holding circuit for holding the detected peak signal for a duration of an input pulse occurring between the rising and falling edges of the input signal, the detected peak signal being held at a central node; a first comparator for changing state a given time delay after the input pulse begins, the given time delay assuring the received input pulse has substantially reached its maximum value; a monostable pulse generator for generating a short pulse in response to the changing state of the first comparator; a second holding circuit for holding a falling edge reference that is proportional to the detected peak signal on the central node; a first switch that is closed by the short pulse from the monostable device for the duration of the short pulse, so as to connect the central node to the second holding circuit; a fall time comparator for comparing (i) the detected peak signal and (ii) the falling edge reference, and for providing a fall time switching signal; a rising edge reference generation circuit for providing a substantially invariant rising edge reference; a rise time comparator for comparing (i) the detected peak signal and (ii) the rising edge reference, and for providing a rise time switching signal; a multiplexer for providing a current control signal, the multiplexer including a portion for selecting the fall time switching signal after the detected peak signal exceeds the rising edge reference but before the detected peak signal subsequently falls below the falling edge reference, so that the amplifying device is provided current so as to operate as a Class A amplifying device during the rising edge of the input pulse so as to reduce the rise time deterioration, and a portion for selecting the rise time switching signal after the detected peak signal falls below the falling edge reference but before the detected peak signal subsequently exceeds the rising edge reference, so that the amplifying device no longer receives substantial current so as to cause it to operate in cutoff during the falling edge of the input pulse so as to reduce the fall time deterioration; and a current control signal differentiation circuit, disposed between the multiplexing means and the amplifying device means, for providing to the amplifying device means a current waveform that is a shaped version of the current control signal.

The invention also provides a method of enhancing performance of a Class C amplifying device in an amplifier, by reducing rise time deterioration and fall time deterioration experienced in response to an input signal having sharp rising and falling edges, the enhancement method including the steps of receiving the input signal; causing the amplifying device to operate as a Class A amplifier during the rising edge of the input signal; and causing the amplifying device to operate in cutoff during the falling edge of the input signal.

Modifications and variations of the above-described embodiments of the present invention are possible, as appreciated by those skilled in the art in light of the above teachings. For example, the various component values and component types may be varied in accordance with principles known to those skilled in the art. Also, the edge enhancement principles may be applied to amplifying and switching devices, and in environments, other than those which are specifically disclosed above. Moreover, the particular choice of ground and positive voltages as levels for digital signals is made purely for the sake of convenience, and should not limit the scope or applicability of the invention. It is therefore to be understood that, within the scope of the appended claims and their equivalents, the invention may be practiced otherwise than as specifically described.

What is claimed is:

1. An enhancement circuit for enhancing performance of a Class C amplifying device in an amplifier, by reducing rise time deterioration and fall time deterioration experienced in response to an input signal having sharp rising and falling edges, the enhancement circuit comprising:

first means for causing the Class C amplifying device to function as a Class A amplifier during the rise time of the input signal; and second means for causing the Class C amplifying device to function in cutoff during the fall time of the input signal.

2. The enhancement circuit of claim 1, wherein the first causing means includes:

means for injecting current into the base-emitter junction of a bipolar transistor that comprises the amplifying device.

3. The enhancement circuit of claim 1, wherein the second causing means includes:

means for substantially cutting off current passing through the base-emitter junction of a bipolar transistor that comprises the amplifying device.

4. The enhancement circuit of claim 1, wherein the first and second causing means collectively include:

means for switching on a current pulse early in the rise time of the input signal; and means for cutting off current early in the fall time of the input signal.

5. The enhancement circuit of claim 1, wherein the first and second causing means collectively include an in-series arrangement of:

a peak detector;

a comparator;

a monostable pulse generation device;

a storage device storing a charge proportional to and less than a peak value of the input signal;

two comparators, arranged in parallel, receiving a detected input signal and respective threshold signals; and a control device responsive to the two comparators and providing a current control signal to the amplifying device which causes the amplifying device to generate sharper rising and falling edges.

6. An amplifier apparatus, comprising:
a) a Class C amplifying device means for amplifying an input signal, the Class C amplifying device means exhibiting a rise time deterioration and a fall time deterioration experienced in response to an input signal having sharp rising and falling edges; and
b) an enhancement circuit for enhancing performance of the Class C amplifying device means, by reducing the rise time deterioration and fall time deterioration, the enhancement circuit comprising:
1) first means for causing the Class C amplifying device to function as a Class A amplifier during the rise time of the input signal; and
2) second means for causing the Class C amplifying device to function in cutoff during the fall time of the input signal.

7. An amplifier apparatus, comprising:
a) a Class C amplifying device means for amplifying an input signal having at least a first level and a second level, the Class C amplifying device means exhibiting a rise time deterioration and a fall time deterioration;
b) an enhancement circuit, including:
1) means for generating a detected signal in response to the input signal;
2) first reference generation means for providing a first reference in response to the input signal;
3) fall time comparison means for comparing the detected signal to the first reference and for providing a first comparison signal;
4) second reference generation means for providing a second substantially invariant reference;
5) rise time comparison means for comparing the detected signal to the second reference and for providing a second comparison signal; and
6) multiplexing means for controllably combining the first and second comparison signals and providing a current control signal to the Class C amplifying device means so that it operates as a Class A amplifying device during the rise time and operates in cutoff during the fall time, to reduce the rise time deterioration and fall time deterioration.

8. An amplifier apparatus for reducing rise time deterioration and fall time deterioration experienced in response to an input signal having sharp rising and falling edges, the amplifier comprising:
a) an RF input port means for receiving the input signal;
b) a Class C amplifying device means for amplifying the input pulse;
c) a peak detector means for detecting a peak value of the received input signal so as to provide a detected peak signal;
d) first holding means for holding the detected peak signal for a duration of an input pulse occurring between the rising and falling edges of the input signal, the detected peak signal being held at a central node;
e) first comparator means for changing state a given time delay after the input pulse begins, the given time delay assuring the received input pulse has substantially reached its maximum value;
f) a monostable means for generating a short pulse in response to the changing state of the first comparator means;

g) second holding means for holding a falling edge reference that is proportional to the detected peak signal on the central node;
h) a first switch that is closed by the short pulse from the monostable device for the duration of the short pulse, so as to connect the central node to the second holding means;
i) a fall time comparator means for comparing (i) the detected peak signal and (ii) the falling edge reference, and for providing a fall time switching signal;
j) a rising edge reference generation means for providing a substantially invariant rising edge reference;
k) a rise time comparator means for comparing (i) the detected peak signal and (ii) the rising edge reference, and for providing a rise time switching signal;
l) multiplexing means for providing a current control signal, the multiplexing means including:
1) means for selecting the fall time switching signal after the detected peak signal exceeds the rising edge reference but before the detected peak signal subsequently falls below the falling edge reference, so that the amplifying device means is provided current so as to operate as a Class A amplifying device during the rising edge of the input pulse so as to reduce the rise time deterioration; and
2) means for selecting the rise time switching signal after the detected peak signal falls below the falling edge reference but before the detected peak signal subsequently exceeds the rising edge reference, so that the amplifying device means no longer receives substantial current so as to cause it to operate in cutoff during the falling edge of the input pulse so as to reduce the fall time deterioration; and
m) a current control signal differentiation circuit, disposed between the multiplexing means and the amplifying device means, for providing to the amplifying device means a current waveform that is a shaped version of the current control signal.

9. A method of enhancing performance of a Class C amplifying device in an amplifier, by reducing rise time deterioration and fall time deterioration experienced in response to an input signal having sharp rising and falling edges, the enhancement method comprising the steps of:
receiving the input signal;
causing the amplifying device to operate as a Class A amplifier during the rising edge of the input signal; and
causing the amplifying device to operate in cutoff during the falling edge of the input signal.

10. The method of claim 9, further comprising the steps of:
sensing the rising edge and falling edge of the input signal; and
generating a rising edge threshold voltage and a falling edge threshold voltage which are used in the two causing steps.

11. The method of claim 10, wherein the step of generating a falling edge threshold voltage includes the steps of:
sensing a maximum value of the input signal; and
determining the falling edge threshold value to be substantially proportional to the maximum value of the input signal.

12. The method of claim 11, wherein the step of determining the falling edge threshold value includes:
determining the falling edge threshold value to be approximately 90 percent of the maximum value of the input signal.

* * * * *